United States Patent [19]

Reeb

[11] Patent Number: 4,990,891

[45] Date of Patent: Feb. 5, 1991

[54] IDENTIFICATION DEVICE IN THE FORM OF A TAG-LIKE STRIP AFFIXABLE TO AN ARTICLE

[76] Inventor: Max-E. Reeb, Helfensteinstrasse 7, D-7336 Uhingen, Fed. Rep. of Germany

[21] Appl. No.: 135,547

[22] Filed: Dec. 18, 1987

Related U.S. Application Data

[60] Continuation of Ser. No. 28,893, Mar. 23, 1987, abandoned, which is a division of Ser. No. 513,970, filed as PCT DE82/00210 on Oct. 29, 1982, published as WO83/01697 on May 11, 1983, Pat. No. 4,694,283.

[30] Foreign Application Priority Data

Oct. 30, 1981 [DE] Fed. Rep. of Germany ....... 3144208

[51] Int. Cl.$^5$ ............................................. G08B 13/18
[52] U.S. Cl. ...................... 340/572; 29/846; 333/219; 428/901
[58] Field of Search ................ 340/572; 428/901; 333/219; 29/846, DIG. 3, 16, 40

[56] References Cited

U.S. PATENT DOCUMENTS

4,311,992 1/1982 De Chant ............................. 340/572
4,369,557 1/1983 Vandebult ........................... 340/572

Primary Examiner—Glen R. Swann

[57] ABSTRACT

An identification device for use in electronic security systems is proposed carrying a planar resonant circuit and suiting for use as a marker means for preventing theft of articles to which it is affixed. The device comprises two counter-turning conductive paths forming CW and CCW spiral patterns (if viewed from the same side) in opposition aligned to each other turn by turn and at least one insulative layer spaced therebetween. Said layer may be absent in lateral turn-to-turn spaces or may at least have a reduced total thickness effective therein; it may at least in part configure as a sheet as well. Due to a minimized metal coverage on its real estate the resonant circuit features a low RF magnetic field deflection and hence a high in-system detectivity.

38 Claims, 3 Drawing Sheets

IDENTIFICATION DEVICE IN THE FORM OF A TAG-LIKE STRIP AFFIXABLE TO AN ARTICLE

CROSS-REFERENCE TO RELATED APPLICATIONS

This Application is a continuation of Application Ser. No. 28,893 filed Mar. 23, 1987 which is a division of U.S. Ser. No. 513,970 filed as PCT DE82/00210 on Oct. 29, 1982, published as WO83/01697 on May 11, 1983, now U.S. Pat. No. 4,694,283 issued Sept. 15, 1987.

BACKGROUND OF INVENTION AND FIELD OF INVENTION

The invention relates to an identification device in the form of a tag-like strip affixable to an article and comprising at least one inductive member formed of flat conductor strips and one capacitive member formed of superposed conductor strip portions with a dielectric interposed therebetween, said capacitive member forming with the inductive member a closed resonant circuit.

Identification devices of this type have been known, for example, from German AS 2,826,861. They essentially contain an electric parallel resonant circuit and are contemplated for generating characteristic signals permitting the identification thereof in a high frequency electromagnetic field. Such passive identification devices are used in production engineering for identifying work pieces, in analysis technology for identifying samples, as safeguarding means and as identifying sensors in product safeguarding systems, especially antitheft systems.

When such devices are required in very large numbers the manufacturing costs are of essential significance to the economical use of the system. The conventional identification devices are manufactured, for example, by etching conductor strips out of metal foils applied on both sides of a flexible, electrically non-conductive carrier sheet. The etched conductor strips form the required inductive member, while the capacitive member of the resonant circuit is formed by distributed capacities formed by opposed conductor strip portions and the interposed dielectric carrier sheet. In order to connect the conductor strips on the two sides of the carrier sheet so that together they cooperate to form an inductive member, contact through the carrier sheet is necessary. Furthermore, manufacturing methods requiring etching on both sides are very expensive and contact through the sheet requires a piece-by-piece check of each individual resonant unit.

SUMMARY OF INVENTION

A first object of the invention is to provide an identification device which permits economical mass production so that it is disposable for one-time use. A second object of the invention is to provide an identification device that exhibits close tolerances of the resonant frequency, and lends itself to a low cost make. A third object of the invention is to provide identification devices having a high reliability.

The first object is achieved by an identification device of the aforementioned type having conductor strips arranged mutually aligned, so as to cover each other, in two superposed planes, and spaced from one another by at least one insulative layer. Between any two mutually superposed conductor strips a certain capacitance exists. The total of all capacitances and the inductance of the conductor strips suffice for a resonance capability even without particular capacitor plates, by that the effective capacitance, in the manner of a stripline, distributes along all insulatively spaced conductor strips. The conductor strips configure as two planar spiral paths, which counter turn, if viewed from the same side, in a turn-to-turn alignment with respect to each other. Said spiral paths may conductively connect to each other, or not. At least a dielectric path, or a continuous sheet, or various layers may space said spiral paths.

Since respective turns of the inductive member are directly superposed, an excellent magnetic coupling is achieved between respective turns so that but minor turn leakage inductance encounters and thus precise transformation rations for the distributed capacitances, contributing to the totally effective resonant circuit capacitance, can be maintained.

The second object is achieved by that the conductor strips have different configurations and/or dimensions in the superposed areas, particularly different widths. Thereby but small capacitance deviations result from mutual alignment errors within limits for close tolerances of the resonant frequency.

The third object is achieved by that superposed conductive members either configure as an integral one-piece, or merely capacitively couple to each other through the dielectric spacing them. Product weakness owing to unreliable interconnections is thus overcome.

The identification device according to the invention may be produced, for example, by that the windings of the inductive member are arranged in a superpositive alignment with respect to each other by so folding a conductor strip structure, that the number of turns is virtually unlimited and the required distributed capacitances can be provided by selective interposition of dielectric layers between conductor strip portions folded one onto the other. Accordingly, a plane conductor strip structure may be folded along at least one fold line such, that conductor strip portions disposed in at least two superposed layers, especially planes, cooperate to form an inductive member, and between at least two conductor strip portions folded one upon the other a dielectric is interposed to form the capacitive member.

Therefore, said inductive and capacitive members are formed of at least one conductor strip structure applied on a flexible and electrically insulating carrier sheet which can be counter folded against itself. The structurally desired fold lines are marked by perforations, properly located positive folding lines or the like. The conductor strip structure may be coextensive from one folded plane to the next so that the windings of the circuit inductor extend continuously from one plane to the other. Depending on the particular application, merely capacitive coupling can be provided between two superposed conductive members through the dielectric in the form of at least one insulative layer.

In practice said perforations or fold lines will have certain tolerances regarding their position relative to the conductor strip structure. If the superposed conductor strip portions have different configurations and/or dimensions, a certain positional parallel shift with respect to each other may be allowed without effecting a change in capacitance.

In order to minimize the manufacturing costs the conductor strips are preferably cut or punched out of a metal foil. For easy handling or processing of the punched-out conductor strips they may be applied on a flexible, electrically insulating carrier sheet which, after folding, also ensures mutual insulation of the superposed conductor strip portions. The conductor strips could be provided with an insulative coat on one or both faces thereof.

The dielectric may be applied directly on respective conductor strip portions in the form of a coating, or a dielectric film or a sheet interposed between the conductor strip portions when the conductor strip structures are positioned one onto the other. At least one adhesive layer may be additionally inserted for effecting a fixing together of superposed parts.

As a modification the conductor strips can be etched out of a metal foil which may be applied on an electrically non-conductive flexible carrier sheet. The conductor strips may also be vapor-deposited, sprayed or applied in other conventional ways, e.g. by electrodeposition or the like, on a flexible electrically non-conductive carrier sheet.

Since the conductor strip portions may be made extremely thin, a sufficiently high inductance and capacitance value can be achieved and nevertheless the entire identification device can be made very thin. Hence, the identification device can be made highly flexible and, in particular, it can be processed like a conventional paper, plastic or cardboard tag.

In order to protect the finished resonant structure it may be sealed into a flexible and electrically insulative sheet or may be embedded into a flexible electrically insulating composition and brought into the shape of a flexible tag-like strip. Although the resonant structure may consist of numerous, layers the tag-like strip may be very thin and flexible so that, if a plurality of individual structures is sealed into a continuous carrier sheet to form a plurality of individual identification devices, a plurality of individual identification devices can be continuously rolled up into a supply roll.

Identification devices according to this invention, despite very low manufacturing costs, exhibit close tolerances of the resonant frequency and a satisfactory Q-factor. They are protected against non-destructive manipulation and therefore suit for security systems meeting severe requirements. The device and its unique structure will be explained in more detail in course of the following description of the preferred embodiments.

BRIEF DESCRIPTION OF THE DRAWINGS

Further advantages and features of the invention will become apparent from the following description of several examples of the invention with reference to the attached drawing, from the subclaims, and from the drawing. In the drawing

DETAILED DESCRIPTION OF THE PREFERRED EMBODIMENT

The chief element of the identification device of the invention is an electric unit constituting a parallel resonant circuit and being formed of an inductive member and distributed capacities. Hereafter this electrical unit will first be described.

Since the described identification device can be manufactured especially rapidly and simply with a minimum of waste of raw material, it is especially useful for provision in merchandise price tags and safeguarding tags.

Figures 1, 2, 3A, 3B, 3C, 4, 5, 6, 7, 8, 9:
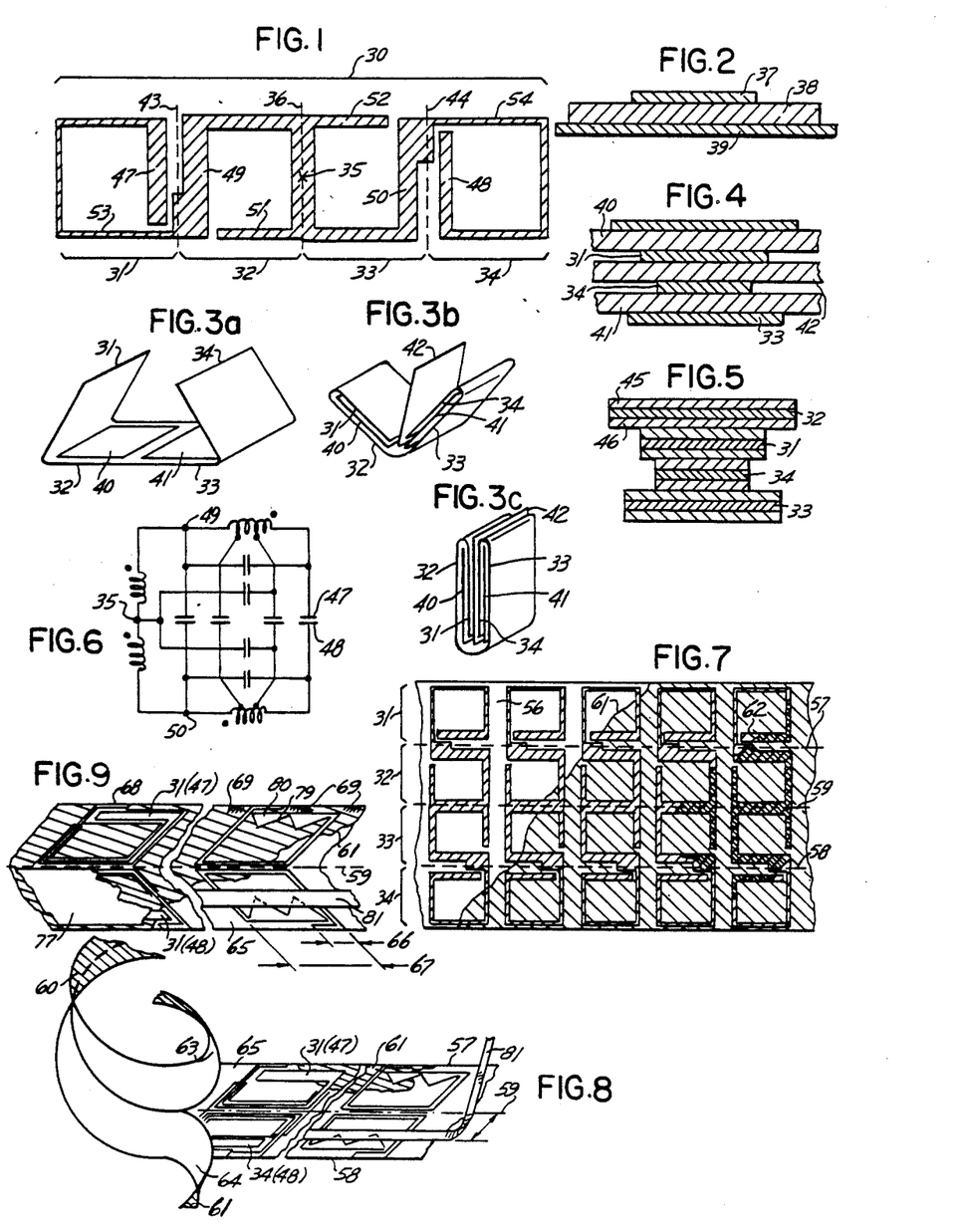
FIG. 1 shows a schematic view of a conductor strip structure developed into a plane which, when suitably folded together, results in an inductive member.
FIG. 2 is a cross-sectional view of a conventional strip line.
FIGS. 3a-3c show several schematic views for explanation of folding of the conductor strip structure illustrated in FIG. 1.
FIGS. 4 and 5 are partial sections through the folded structure shown in FIG. 3.
FIG. 6 is an equivalent circuit diagram of the electrical unit shown in FIG. 1 and FIGS. 3 to 5 forming a parallel resonant circuit.
FIG. 7 is a plan view of a carrier sheet carrying a plurality of conductor strip structures for the manufacture of identification devices.
FIGS. 8, 9 and 10 are schematic views for explanation of further embodiments of the invention permitting adjustment of the capacitive member in the course of manufacture.

From a thin metal foil, which may already be inseparably coated on one or both sides with suitable dielectric coatings, a planar structure 30 having the structure of a conductor strip as shown in FIG. 1 is produced. It is an essential property of the conductor strip structure consisting of four coherent partial structures 31 to 34 (hereinafter termed "leaves" and illustrated in simple sketches as continuous leaves) that, although it appears to be symmetrical with respect to the center point 35, all the conductor strip portions symmetrically opposed with respect to the axis 36 have different widths. By way of explanation FIG. 2 is a cross section through a strip conductor consisting of a wave guide strip 37, a dielectric of constant thickness 38, and a ground area 39 which is larger than the width of the wave guide strip. When the wave guide strip is laterally shifted this does not affect capacitance per unit length thereof. In case the conductor strip structure shown in FIG. 1 is manufactured from uncoated metal foil, it will be folded as shown in the simplified sketches of FIGS. 3a-3c with interposition of the dielectric layers 40, 41 and 42, along the fold lines 43, 44 and 36 in FIG. 1 so as to result in a cross section through any desired part along the margin of the folded assembly shown in FIG. 4. In case the conductor strip structure shown in FIG. 1 is manufactured from a metal foil previously laminated with suitable dielectric coatings 45 and 46, the insertion of the layers 40, 41 and 42 is unnecessary, and after analogous folding a corresponding cross sectional configuration illustrated in FIG. 5 (i.e. altogether a rectangular structure with a recessed inside region) is obtained.

In both cases a Thomson oscillating circuit is formed having an oscillating capacity composed of the transformation of distributed conductor capacitances and concentrated capacitances of the opposed conductor strip portions 47 and 48, 47 and 49, 48 and 50. In a rough approximation the structure can be described by the equivalent circuit shown in FIG. 6; therein corresponding parts and locations are designated with the same reference numerals as in FIG. 1.

The different widths of superposed (in folded condition) conductor strips have several functions:

(a) Inaccuracies in superposing the individual sheets hardly change the capacitance between conductor strip portions extending one above the other, as long as a positioning tolerance is maintained within geometrically simply determinable and specifiable limits. This effect can be utilized as long as the width of the conductor strips is far greater than the thickness of the dielectric separating layers and the electric field between metal layers thus extends predominantly homogeneously. As a result, the overall effective resonant circuit capacitance is substantially invariable with respect to positioning inaccuracies on folding within registration tolerances and mainly depends on the dimensional accuracy of the conductor strips and on properties of the dielectric.

(b) Since the conductor strips mutually cover each other and the width of the conductor strips is substantially greater than the thickness of the insulating separating layers between the coil windings, the coupling of the spatially distributed windings is very firm and the mutual leakage inductance thereof is very low. This results in very constant transformation conditions for the individual distributed line capacitances.

(c) After having been folded together the leaves 32 and 33, of low impedance in relation to the center point 35 of the structure in FIG. 1 and the coil center 35 of FIG. 6, are disposed at the outside of the device and enclose the leaves 31 and 34 of high impedance in relation to the same points, in the manner of a static shield in the interior of the arrangement with the result that upon capacitive approach the obtained structure only slightly changes its resonant frequency. The branches 51 and 52 are not a component of the coil proper but are low impedance shielding areas which shield the higher impedance line sections 53 and 54 against the outside.

(d) The externally disposed windings of maximum conductor width. i.e. least strip resistance, are the windings in which the highest current flows. Hence, the design of the device also favors the highest possible Q-factor.

High positioning accuracy of the individual leaves placed one upon the other is ensured by positively enforced folding. This is achieved by fixing in the production process the conductor strip structure as shown in FIG. 1, onto a continuous carrier sheet as shown in FIG. 7 and within the same tool when performing this operation, the fixed structure and the carrier sheet 56 are subsequently perforated in a continuous manner with zero track offset shift relative to the fixed structure along the lines 43, 44 and 36 in FIG. 1 so that perforation lines 57, 58 and 59 are formed along the direction of advance of the sheet 56, as shown in FIG. 7, along which the continuous sheet can be folded together.

The perforation is made such that an electrically conductive connection is retained through the perforated region of the structure;

that the longitudinal stiffness of the substrate material can be utilized to enhance guided folding; and that portions of the carrier sheet no longer needed can be removed once the sheet has been folded along the perforation.

If, for the production of the structure shown in FIG. 1, a metal foil dielectrically coated on both sides is used as starting material, the insertion of the sheet-like insulating layers 40, 41 and 42 during folding is unnecessary. Since the dielectrically reacting layers shown in FIG. 5 then have the same contours as the conductor strips, the interiors and exteriors of the finally folded device are then free of any material.

The dimensionally stabilizing incorporation of the unit between protective covering faces may be accomplished during production, in a manner shown in FIGS. 7, 8 and 9, by using as continuous carrier sheet 56 a material suited for this purpose and provided, for example, with areas 60 to be printed, and having on the free side an adhesive or sealing film 61 producing differential adhesion in the zones inside and outside the perforation lines 5.7 and 58 capable of being selectively activated, e.g. under the influence of pressure and/or heat. After the transfer of the structure consisting of the leaves 31 to 34 to such a carrier sheet the zone-wise differential adhesion has the effect that the leaves 32 and 33 initially adhere more firmly to the sheet 56 than do the leaves 31 and 34.

By means of a suitable method an extremely thin adhesive layer 62 is applied onto the surface of the conductor strip structure, but not onto the sheet, as indicated in FIG. 7, which, after folding along the lines of perforation 57 and 58, produces higher adhesiveness between the leaves 31, 32 and 34, 33 respectively than that initially produced between the sheets 32. 33 and the sheet 56.

After the performance of the first folding operation along the lines of perforation 57 and 58 which adhesively positions the leaves 31, 32 and 34, 33 on each other, this permits the separation and removal of carrier sheet portions 63 and 64 no longer required along the perforation lines 57 and 58, as shown in FIG. 8, without the conductor strip structures being removed from the remainder 65 of the carrier sheet. The second folding operation along the perforation line 59 then positions the leaves 31 and 34 on each other, as illustrated in FIG. 9.

When, after the last folding operation which closes the structure to form a resonant circuit, the adhesive or sealing film 61 inside the portion 65 of the carrier sheet 56 which remained as an external sheath is activated in a suitable way, e.g. under the influence of pressure and/or heat, the described structural feature has the additional effect that the folded structure is sheathed not only regarding the recessed interior but is also sealed along the external perforation margins in the areas 69

This ensures high stability of the device against displacement so that the resulting strip can be rolled up into a supply roll.

Figure 11:
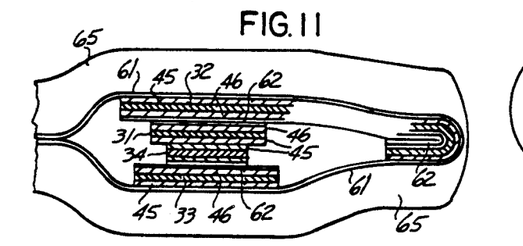
FIG. 11 is a section through a marginal zone of a final identification device sealed into protective film.

By way of illustration FIG. 11 shows a cross section through the external region of a device produced in this way.

Figure 12:
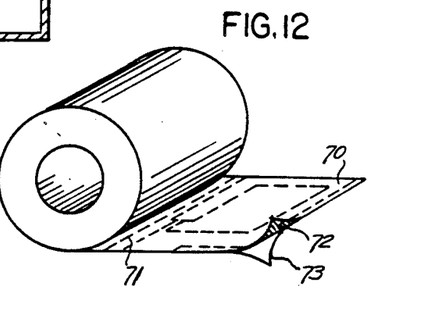
FIG. 12 is a schematic view of a carrier sheet rolled up into a supply roll into which a multiplicity of final electrical identification devices are sealed and which is adhesive.

According to FIG. 12, with this method a great number of thin and flexible resonant members 70 can be produced which are encased in a continuous sheath. They can be either cut off individually from said continuous strip or, after a severing perforation 71 and provision with pressure sensitive adhesive 72 and delaminating film 73, can be flexibly transferred to articles by means of automatic roll-off dispensers In a continuous manufacturing process of the described type the resonant frequency of the device can be maintained within predeterminable frequency limits regardless of any occurring variations of the properties of the dielectrics 45, 46 and 40, 41, 42, of the adhesive layer 62, or of the carrier sheet 56 and of any other process parameters in that, according to FIG. 10, contours 79 of capacitively active adjusting conductor strip portions 80 are provided obliquely relative to the direction of advance of the carrier sheet, and between said conductor strip portions 80 a continuous insulating tape 81 of sufficient width and having a rather low relative permittivity and sufficient thickness is inserted so as to extend in the direction of advance of the carrier sheet. Thereby the active circuit capacitance and thus the resonant frequency of the final device can be influenced in response to the track spacing 82 of said adjusting tape from the perforation line 59.

In this way a suitable closed control circuit which contactlessly detects the actual frequency of manufactured devices, continuously compares it with a predetermined set frequency, and the dynamic of which is tunable to the number of manufactured devices per unit of time, can control the maintenance of predetermined resonant frequency limits automatically via control of the track spacing.

Figure 10:
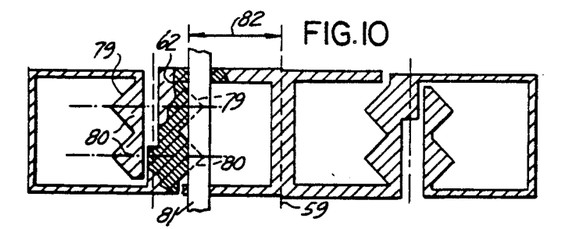

The insertion of such an adusting tape 81 can be effected either by rolling it onto the still unfolded structure after application of the adhesive layer 62 by utilizing the adhesion of said very layer, as shown in FIG. 10, or can be effected in the same way after the first folding operation by utilizing selective adhesive properties of the carrier sheet, as indicated in FIGS. 8 and 9, depending on the desired adjusting sensitivity.

Figure 13:
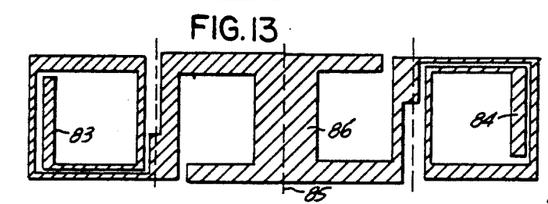
FIG. 13 is a plan view on a conductor strip structure devloped into a plane for the manufacture of an outwardly shielded identification device with four superposed planes and increased inductance.

The inductance can be increased and the shielding effect improved while retaining the four-leaf principle shown in FIG. 13 by increasing the number of windings of the leaves inwardly disposed after folding. To this end the conductor strip portions 83 and 84 acting as capacitor coatings may be so arranged that they come to lie below the two outwardly disposed halves of the central conductor strip 86 of the structure last folded along the line 85 which has the lowest coupling impedance. This further reduces any influence on the resonant frequency of such a resonant structure approached by capacity-influencing objects.

Figure 14:
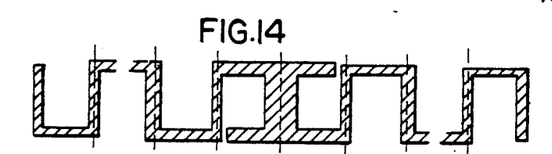
FIG. 14 is a plan view on a conductor strip structure for the manufacture of an identification device with eight or more superposed fold planes.

The same effect is achieved when there are more than four leaves to one structure. The possible form of a multi-leaf structure which may also be asymmetrically continued on both sides in meander-fashion, is illustrated in FIG. 14. The required stepping of the conductor strip widths is only sketched.

Figures 15, 20, 21, 22, 23:
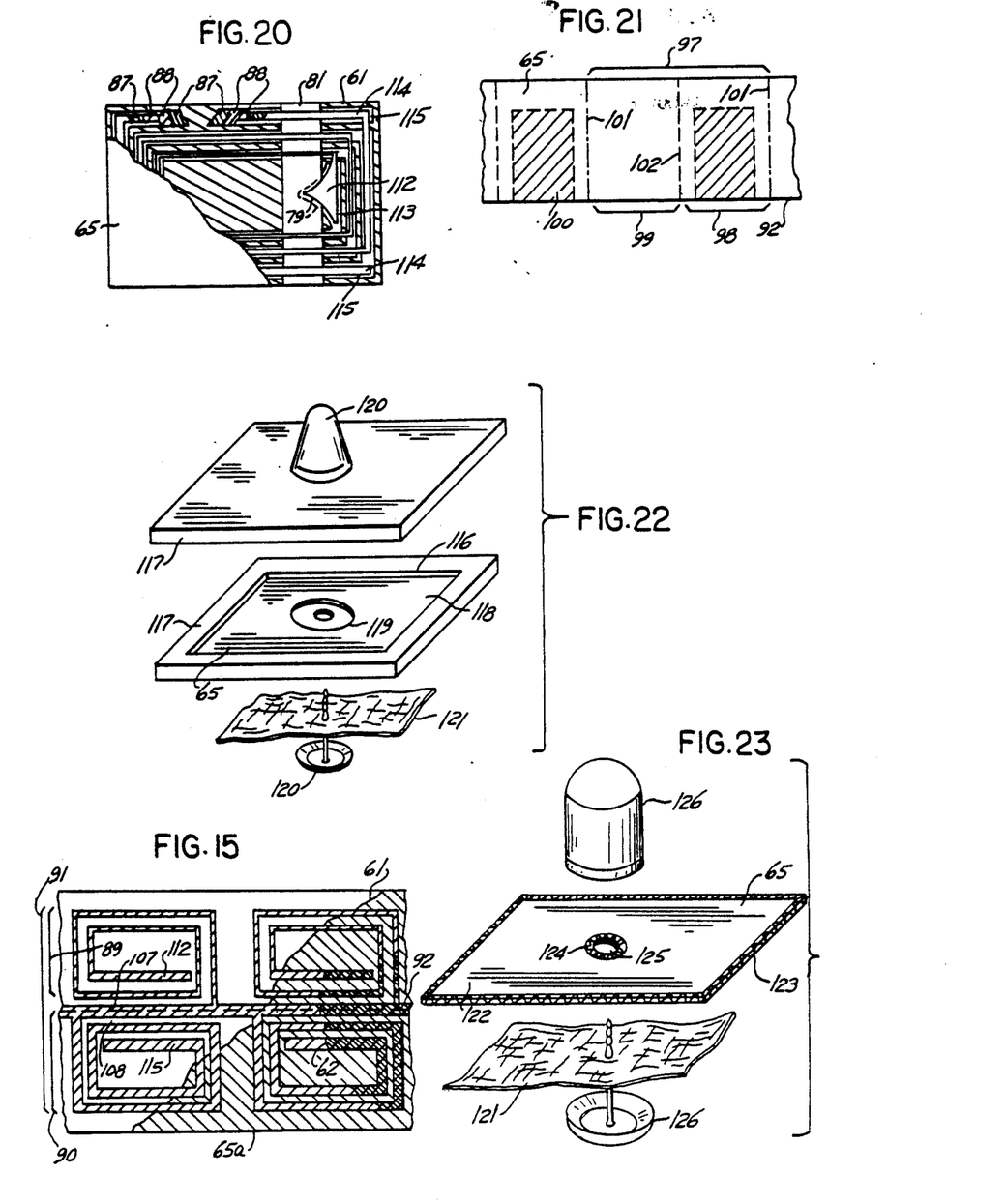
FIGS. 15 and 16 are schematic views for explanation of the manufacture of an identification device with only two fold planes.
FIG. 20 is a schematic view for explanation of the adjustment of the capacitive member in the embodiment of FIGS. 17 and 18 by means of a dielectric adjustment tape.
FIG. 21 shows a schematic plan view of a strip-shaped carrier alternately provided with an area carrying an identification device and a vacant area.
FIG. 22 shows an exploded view for explanation how an identification device of the invention can be affixed to an article to be safeguarded.
FIG. 23 is an exploded view of another embodiment of affixing to an identification device to an article to be safeguarded.

Two-leaf devices can be produced rapidly and especially simply by producing from a thin metal foil 87 provided with a suitable dielectric coating 88 a flat conductor strip structure 91 composed of two partial leaves 89 and 90, as illustrated in FIG. 15, fixing it on an adhesive or sealable carrier sheet 65a, and then folding the latter together with the conductor strip fixed thereto along a line of perforation 92 produced with zero tract offset shift relative to the fixed conductor strip structure and continuously penetrating the conductor strip structure and the carrier sheet so that the dielectric coatings are encased between the conductor strips of the folded structure Here, too, the principle of electric conductance through a zone of perforation along a fold line is applied. If the starting material is a metal foil 87 bearing no dielectric coating 88, a dielectric 93 must be inserted between the two partial leaves as shown in FIG. 16 In this case, too, a Thomson oscillating circuit with distributed capacitances is formed Trial samples showed that fixing by a special adhesive layer 62 of the dielectric layers 88 to one another or of the conductor strip 87 to a dielectric 93 to be inserted becomes unnecessary if the structure is enclosed all around in the sheathing material 65 by a suitable sealing film 61.

In this embodiment, too, capacitor areas are most favorably disposed so that they are oriented lengthwise in winding direction, because in this way, as a component of the coil winding, they permit the maximum induction area with a minimum of field distortion.

If the superposed conductor strips are sufficiently large, special capacitor areas are unnecessary so that then the windings are open-ended, in the interior of the sheet structures.

Figure 16:
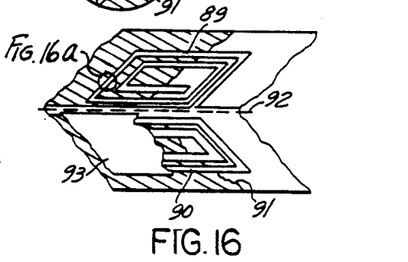
Figure 16A:
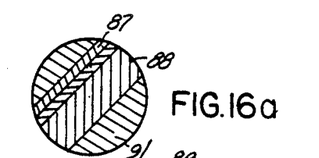
Figure 19:
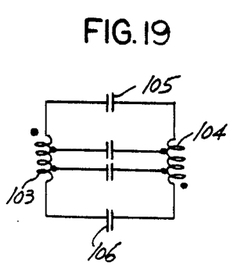
FIG. 19 is an equivalent circuit diagram of the embodiment of FIGS. 17 and 18.

If one departs from the principle of electrical condition through a perforated zone along a fold line and in the embodiment of FIG. 16 the electrically conductive connection along the perforation line 92 is separated one obtains a parallel resonant circuit, as shown in FIG. 19, with series arranged inductances 103 and 104 and series arranged capacitances 105 and 106 in that the capacitive coating functions as a serial capacitor 106 between the mutually insulated conductor strip halves 107 and 108 along the perforation line 92. In FIG. 19 also the distributed capacitances of the winding areas with respect to each other are indicated.

Figure 17:
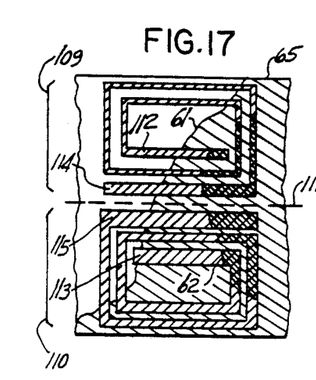
FIGS. 17 and 18 are schematic views for explanation of an embodiment in which only capacitive coupling exists between two superposed planes.
Figures 18, 18A:
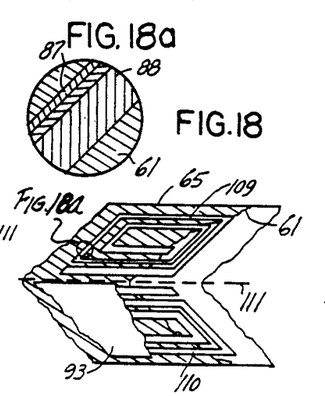

Such embodiment can be produced rapidly and simply, again with the application of the principle of marginally unlike overlying conductor strip widths for extensive frequency invariance relative to positioning inaccuracies, in that from a thin metal foil 87 - which may already be provided with a suitable dielectric coating 88 on one side - two separate planar structures 109 and 110 are produced as shown in FIG. 17, and are fixed on an adhesive or sealable carrier sheet 65; when performing this operational step the latter is subsequently perforated in a continuous manner between the structures with zero track offset relative to the fixed conductor strip structures 109 and 110 positioned thereon - with a dielectric 93 inserted therebetween, if necessary - it may be folded along the resulting perforation line 111 so that the two conductor strip structures 109, and 110 lie one upon the other and are capacitively, rather than electrically, coupled through the insulating interlayer 88 or 93, as shown in FIG. 18, and the thus obtained resonant member is sealed on all sides within the carrier sheet 65 forming a protective sheath In order to influence the resonant frequency, again an adjusting tape 81 is provided (FIG. 20) cooperating with adjusting areas 112 and 113, as explained in detail with reference to FIG. 10. The adjusting areas 112 and 113 are so constructed that there is approximately square response of the adjustment capacitance to the parallel shift of the adjustment tape 81, or linear response of the resonance frequency to said parallel shift.

Since the described identification device can be produced not only very rapidly and simply but also with a minimum of raw material waste, it is especially suitable for use in merchandise safeguarding identifying price tags.

According to FIG. 21, to this end a data-bearing double price tag 97 for example—consisting of a cash register section 98 provided with such an identification device and a customer's section 99 without such a device—can be produced by using as production facilitating carrier 165 an accordingly pre-printed sheathing material suited as a data-carrier medium, and by leaving adequate space between the structures fixed to said carrier so that, after folding along the perforation line 92 and sealing of the carrier, there alternate in succession one area provided with a resonant member 100 and one area without such a member. Thereafter this tape is provided with transverse perforations following the incorporated resonant members in predetermined spaced relation for separation of individual tags, and one transverse perforation 102 there-between for separating customer's and cash register sections In case merchandise and price data on such tags are not manually but automatically inputted into the cash register by means provided for this purpose, such a resonant member can also be contained in the customer's section, provided the customer's section is punched in a suitable place in the read-in apparatus directly after registration, and the resonant member in the interior thereof is thereby inactivated.

Since this device is not shielded against the environment, and merchandise safeguarding tags should be sized as small as possible, it may be that changes in the circuit capacitance and thus in the resonant frequency occur in case large areas thereof are covered by objects or body portions.

In order to minimize this effect, the following measures are taken according to preferred embodiments:

The sheathing material is made sufficiently thick, and the essential portion of the oscillating circuit capacitance is located at the periphery of the device, i.e. commencing in the capacitive coating between the first windings and concentrated along the line of perforation;

the ends of the coil are terminated with capacitor coatings of only relatively small area;

the relative permittivity of the dielectric is made as high, and the relative permittivity of the sheathing material is made as low as possible.

As a component of electronic systems for theft detection of merchandise or for supervising the authorized access of persons conventional devices have been in use which comprise, in a rigid housing essentially consisting of two parts, an oscillating circuit composed of a coil winding of bare insulated wire and a capacitor of conventional design connected to the ends of the coil winding.

The assembly of these parts in the hitherto customary way may be obviated in that, according to FIG. 22, one of the described resonant devices 118 is placed into an adequate flat recess 116 in the interior of a similarly designed casing 117; the paper or cardboardlike carrier sheath 65 of such a device can be provided with a perforation 119 within the encased resonant structure in order to receive a closing mechanism 120 that may be required for detachable mounting of the entire structure to garments 121.

If such a closing mechanism need not be inseparably connected to an identification device, and if the identification device itself is to be designed as a flexible, resistant, repeatedly usable tag 122, such a tag can be produced, according to FIG. 23, in that as production facilitating carrier 65 - and thus as sheathing material of the resonant member - a sufficiently thick, tear-resistant material with bend-resistant reinforcement is used which can be sealed, if required, by a sealed seam 123 along the margins to render the device tear resistant.

A bore 125 in the inner area of such a tag whose margin is likewise reinforced by sealing 124 may permit detachable mounting to merchandise 121 with customary devices 126 suitable for this purpose.

I claim:

1. An identification device in the form of a tag-like strip affixable to an article, comprising at least an inductive member formed of flat conductor strips and a capacitive member formed of superposed flat conductor strips and a dielectric layer interposed therebetween and forming, together with said inductive member, a resonant circuit, wherein said flat conductor strips (89, 107,112; 90, 108, 113; 109, 112, 114; 110, 113, 115), in a manner so as to form striplines having distributed line inductances and distributed line capacitances, in mutual alignment, oppose one another in a first and a second plane and wherein said flat conductor strips form a first (clockwise-wound) multi-turn conductive spiral pattern (89, 107, 112; 109, 112, 114) and a second (counter-clockwise-wound) multi-turn conductive spiral pattern (90, 108, 113; 110, 113, 115) in said respective first and second plane, and wherein at least a first end portion (107, 114; 108, 115; 112; 113) belonging to a specific turn of said first multi-turn conductive spiral pattern in said first plane is superposed to the corresponding specific turn of said second multi-turn conductive spiral pattern in said second plane, and wherein the dielectric is arranged at least in spaces between mutually superposed flat conductor strips (between 89 and 90; 107 and 108; 112 and 113, 114 and 115).

2. The device according to claim 1 wherein said dielectric layer is arranged between facing sides of mutually opposing flat conductor strips (87; 89, 90; 109, 110; 112, 113, 114, 115) and, at least in part, is formed of a homogenous dielectric sheet (93; 81) extending therebetween.

3. The device according to claim 1 wherein said dielectric layer is arranged between two facing sides of mutually opposing flat conductor strips (47 to 54; 87; 89, 90; 109, 110; 112, 113; 114, 115) and, at least in part, comprises a dielectric sheet (40; 41; 42; 81; 93) extending therebetween and an electrically insulating layer (45; 46; 88) extending at least on one face of the two opposing conductor strips (47 to 54; 87; 89, 90; 109, 110, 111, 113; 114, 115).

4. The device according to claim 3, wherein at least one electrically insulating layer (40 to 42; 45; 46; 81; 88; 93) is provided, which layer on its first face bonds to a face of said at least two mutually opposing flat conductors paths (31, 34; 47 to 54; 89, 107, 112; 90, 108, 113; 108, 112, 114; 110, 113, 115) and on its second face bonds to another layer having dielectric properties (40; 41; 42; 45; 46; 81; 88; 93).

5. The device according to claim 3, wherein the overall effective thickness of the interposed dielectric (45 and 46; 45 and/or 46 and 40 or 41 or 42, 81; (81), 88, 93) between mutually opposing flat conductor strips is greater than the average thickness of the dielectric provided in the lateral spaces between adjacent flat conductor strips forming multiple turns.

6. The device according to claim 1, wherein said dielectric layer is arranged between facing sides of mutually opposing flat conductor strips (47, to 54; 87; 89, 90; 109, 110; 112, 113; 114, 115) and, at least in part, comprises:
  a first electrically insulating layer (40 to 42; 45; 46; 81; 88; 93) having a first thickness and extending at least on the face of flat conductor strips in a first plane, and of
  a second electrically insulating layer (40 to 42; 45; 46; 81; 88; 93) having a second thickness and extending at least on the face of flat conductor strips in a second plane, so that the spacing of said flat conductor strips in said first and second plane at least in part is the sum of said first and second respective thickness.

7. The device according to claim 6, wherein at least one electrically insulating layer (40 to 42; 45; 46; 81; 88; 93) is provided, which layer on its first face bonds to a face of said at least two mutually opposing flat conductors paths (31, 34; 47 to 54; 89, 107, 112; 90, 108, 113; 108, 112, 114; 110, 113, 115) and on its second face bonds to another layer having dielectric properties (40; 41; 42; 45; 46; 81; 88; 93).

8. The device according to claim 6, wherein the overall effective thickness of the interposed dielectric (45 and 46; 45 and/or 46 and 40 or 41 or 42, 81; (81), 88, 93) between mutually opposing flat conductor strips is greater than the average thickness of the dielectric provided in the lateral spaces between adjacent flat conductor strips forming multiple turns.

9. The device according to claim 1, wherein said dielectric layer is arranged between two facing sides of mutually opposing flat conductor strips and comprises:
  a first electrically insulating layer (45; 46; 88) having a first thickness and extending at least on the face of flat conductor strips in a first plane, at least one homogenous dielectric sheet (40; 41; 42; 81; 93) having a third thickness, and
  a second electrically insulating layer (45; 46; 88) having a second thickness and extending at least on the face of the other flat conductor strips in a second plane,
so that said dielectric sheet is arranged between said first and second electrically insulating layers and the spacing of said flat conductor strips in said first and second plane at least in part is the sum of at least first and second and third respective thickness.

10. The device according to claim 9, wherein at least one electrically insulating layer (40 to 42; 45; 46; 81; 88; 93) is provided, which layer on its first face bonds to a face of said at least two mutually opposing flat conductors paths (31, 34; 47 to 54; 89, 107, 112; 90, 108, 113; 108, 112, 114; 110, 113, 115) and on its second face bonds to another layer having dielectric properties (40; 41; 42; 45; 46; 81; 88; 93).

11. The device according to claim 9, wherein the overall effective thickness of the interposed dielectric (45 and 46; 45 and/or 46 and 40 or 41 or 42, 81; (81), 88, 93) between mutually opposing flat conductor strips is greater than the average thickness of the dielectric provided in the lateral spaces between adjacent flat conductor strips forming multiple turns.

12. The device according to claim 1, wherein said flat conductor strips (89, 107, 112; 109, 112, 114) in a first of the two planes form a first (clockwise) conductive spiral pattern having clockwise multiple turns, and wherein said flat conductor strips (90, 108, 113; 110, 113, 115) in a second of the two planes form a second (counter clockwise) conductive spiral pattern having counter clockwise multiple turns and wherein both clockwise and counter clockwise conductive spiral patterns face one another, in a mutually registrated opposition with respect one to another, and wherein the dielectric effective between said opposing conductive spiral patterns, at least in part of its thickness, comprises at least one electrically insulating layer forming at least a flat dielectric spiral path (88) having multiple turns and having a minimum outline which is congruent with the outline of one of both clockwise and counter clockwise conductive spiral patterns (89, 107, 112; 90, 108, 113; 109, 112, 114; 110, 113, 115).

13. The device according to claim 1, wherein the flat conductor strips (89, 107, 112; 109, 112, 114) in said first plane forms a first (clockwise) conductive spiral pattern having clockwise multiple turns, and wherein the flat conductor strips (90, 108, 113; 110, 113, 115) in said second plane form a second (counter clockwise) conductive spiral pattern having counter clockwise multiple turns, and wherein said conductive spiral patterns face one another, in a mutually aligned opposition with respect one to another, and wherein the dielectric effective between opposing conductive spiral patterns, at least in part of its thickness, is comprised of a first electrically insulating layer forming at least a first flat dielectric spiral path having clockwise multiple turns and having a minimum outline which is congruent with the outline of said first (clockwise) conductive spiral pattern (89, 107, 112; 109, 112, 114) and of a second electrically insulating layer forming at least a second flat dielectric spiral path having counter clockwise multiple turns and having a minimum outline which is congruent with the outline of said second (counter clockwise) conductive spiral pattern (90, 108, 113; 110, 113, 115), and wherein said clockwise and counter clockwise multiple turns of said first and second dielectric spiral paths face one another in a mutually aligned opposition, and wherein said first (clockwise) conductive spiral pattern (89, 107, 112; 109, 112, 114) is registrated to said second flat dielectric spiral path and wherein said second counter clockwise conductive spiral pattern (90, 108, 113; 110, 113, 115) is registrated to said first flat dielectric spiral path.

14. The device according to claim 1 wherein said dielectric layer is comprised of an electrically insulating layer (88) extending on the opposing face of one of the two multi-turn conductive spiral patterns (87; 89, 90; 109,112,114; 110,113; 115).

15. For use in electronic security systems, an identification device carrying a planar resonant circuit and having the form of a tag-like strip affixable to an article and comprising:
  a first spiral conductive path (39; 109; 87) in a first plane,
  a second spiral conductive path (90; 110; 87) in a second plane arranged in parallel to said first plane,
  an insulating layer (88; 93; 93, 88; 88, 93; 88, 93, 88) spacing opposing faces of said first and second conductive spiral paths and being provided at least in the projected spaces between the mutually facing parts of the first and second conductive paths, said first spiral conductive path and second spiral conductive path being aligned so that they overlap each other over a major portion of the lengths of said conductive paths to form a distributed capacitance by virtue of said alignment.

16. The device according to claim 15, wherein the overall degree of said overlap contributing to the distributed capacitance is at least 70% of the facing areas between conductive elements on opposing surfaces of said insulating layer.

17. The device according to claim 15, wherein the overall degree of said overlap contributing to distributed capacitance typically ranges between 90% and 100% of the facing areas between conductive elements.

18. The device according to claim 15, wherein said distributed capacitance formed of overlapped conductive paths and the insulating layer therebetween depends, to a major degree, on the accuracy of positional registration of portions of one of both conductive spiral paths (89 or 90, 109 or 110) with respect to the cover material (65) carrying the conductive path construction of the device.

19. The device according to claim 15, wherein said distributed capacitance formed of overlapped conductive paths and the insulating layer therebetween substantially depends on the width and width variation of one of the conductive spiral paths (89, 90; 109, 110) only.

20. The device according to claim 15, wherein said insulating layer includes at least a sheet-like continuous insulative substrate (93) substantially extending over the full area of the circuit device.

21. The device according to claim 15, wherein said first spiral conductive path (89, 109) has an inner and an outer portion and wherein said outer portion (107; 114) comprises a conductive path which is wider than the inner portion of said first conductive spiral path.

22. The device according to claim 15, wherein each of said first and second spiral conductive paths (89, 109; 90, 110) have an inner and an outer portion and wherein said outer portions (107, 114; 108, 115) are wider than said inner portions (112; 113; 79).

23. The device according to claim 15, wherein the diameter of said first spiral conductive path (90; 110) is larger than the diameter of said second conductive path (89; 109).

24. The device according to claim 15, wherein the major portion of said conductive paths (89, 90; 109, 110; 87) overlap each other over substantially the entire length of at least one of said conductive paths (89, 90; 109, 110; 87).

25. The device according to claim 15, wherein said first and second spiral conductive paths (89, 90; 109, 110) have substantially equal areas.

26. The device according to claim 15, wherein said first spiral conductive path (90; 110) is wider than said second spiral conductive path (89; 109).

27. The device according to claim 15, wherein said first spiral conductive path forms a first (clockwise-wound) conductive spiral pattern and said second spiral conductive path forms a second (counter-clockwise-wound) conductive spiral pattern, each forming approximately one half of an inductor coil and one half of a capacitive element of the device.

28. The device of claim 27, wherein said inductor coil halves are electrically insulated from each other.

29. The device of claim 27, wherein said inductor coil halves are electrically connected in series with respect one to another, so that said first spiral conductive path forms a first (clockwise-wound) conductive spiral pattern and said second spiral conductive path forms a second (counter-clockwise-wound) conductive spiral pattern each path having a substantially constant direction of turn.

30. The device of claim 29, wherein the electrical connection between said first and second spiral conductive paths is realized by way of said first and second spiral conductive paths' forming an integral one-piece conductor path device of constant material properties along its full length.

31. The device of claim 29, wherein said multi-turn conductive spiral patterns turn with a constant turn direction by at least two times.

32. The device of claim 29, wherein the electrical connection between said first and second conductive paths is realized by way of a connecting means for providing a current path between said first and second individual spiral conductive paths.

33. The device of claim 29, wherein the electrical connection is between outer portions of said first and second spiral conductive paths.

34. The device of claim 15, wherein a first set of flat conductor strips and a second set of flat conductor strips respectively forming clockwise- and counter-clockwise-wound multi-turn conductive spiral patterns are electrically connected to each other in a suitable location along aligned first and second flat conductor strips, so that said multi-turn conductive spiral patterns are electrically connected, and include open inner and outer end portions (107, 114; 108, 115; 112; 113) each turn of which is insulatively superposed to the corresponding turn of the opposed multi-turn conductive spiral pattern.

35. The device according to claim 15, wherein said tag-like strip has a coverface for carrying data and printed information for additionally serving for point-of-sale functions for an article of merchandise to which it is affixed.

36. The device according to claim 15, wherein said tag-like strip has a face provided with an adhesive film which is covered and protected by a delaminating sheet prior to its use.

37. The device according to claim 15, wherein said tag-like strip has a coverface with a punched out hole in the interior of said spirally arranged flat conductor paths.

38. The device according to claim 15, wherein at least a specific one of said spirally arranged conductor paths is provided for being cut out by way of stamping a hole through the entire device for rendering it deactivated with respect to said electronic security system.

* * * * *